United States Patent [19]

Göbel et al.

[11] Patent Number: 6,087,692
[45] Date of Patent: Jul. 11, 2000

[54] DRAM CELL CONFIGURATION AND METHOD FOR ITS FABRICATION

[75] Inventors: Bernd Göbel; Emmerich Bertagnolli, both of München, Germany

[73] Assignee: Siemens Aktiengesellschaft, Munich, Germany

[21] Appl. No.: 09/093,572

[22] Filed: Jun. 8, 1998

[30] Foreign Application Priority Data

Jun. 6, 1997 [DE] Germany ............................ 197 23 936

[51] Int. Cl.[7] .............................................. H01L 27/108
[52] U.S. Cl. .......................... 257/300; 257/306; 257/330
[58] Field of Search .................................... 257/296–306, 257/327–334

[56] References Cited

U.S. PATENT DOCUMENTS

| | | | |
|---|---|---|---|
| 4,763,181 | 8/1988 | Tasch, Jr. . | |
| 4,989,055 | 1/1991 | Redwine . | |
| 5,646,883 | 7/1997 | Krautschneider et al. | 365/156 |
| 5,710,072 | 1/1998 | Krautschneider et al. | 438/197 |
| 5,817,552 | 10/1998 | Roesner et al. | 438/241 |
| 5,854,500 | 12/1998 | Krautschneider | 257/300 |
| 5,977,589 | 11/1999 | Schloesser et al. | 257/302 |

FOREIGN PATENT DOCUMENTS

| | | |
|---|---|---|
| 0 537 203 B1 | 4/1993 | European Pat. Off. . |
| 44 17 150 A1 | 11/1995 | Germany . |

OTHER PUBLICATIONS

"A 250–MHz Skewed–Clock Pipelined Data Buffer" (Heshami et al.), IEEE Journal of Solid–State Circuits, vol. 31, No. 3, Mar. 1996, pp. 376–383.

*Primary Examiner*—David Hardy
*Attorney, Agent, or Firm*—Herbert L. Lerner; Laurence A. Greenberg; Werner H. Stemer

[57] ABSTRACT

A DRAM cell, including memory cells each having a first transistor, a second transistor and a third transistor. The memory cells also have a writing bit line, a writing word line, a read-out word line and a read-out bit line. The first transistor has a gate electrode and a second source/drain region. The second transistor has a gate electrode, a first source/drain region, and a second source/drain region. The gate electrode of the first transistor is connected to the first source/drain region of the second transistor. The second source/drain region of the second transistor is connected to said writing bit line. The gate electrode of the second transistor is connected to the writing word line. The third transistor has a gate electrode, a first source/drain region, and a second source/drain region. The gate electrode of the third transistor is connected to the read-out word line. The second source/drain region of the first transistor is connected to the first source/drain region of the third transistor. The second source/drain region of the third transistor is connected to the read-out bit line. The first, second and third transistors are vertical MOS transistors. The invention also teaches the process steps for fabricating the DRAM cell.

20 Claims, 6 Drawing Sheets

DRAM CELL CONFIGURATION AND METHOD FOR ITS FABRICATION

BACKGROUND OF THE INVENTION

Field of the Invention

The invention relates to a DRAM cell configuration, that is to say a memory cell configuration with dynamic random access in which a memory cell has three transistors.

In DRAM cell arrangements, use is made almost exclusively of so-called single-transistor memory cells. A single-transistor memory cell includes a read-out transistor and a storage capacitor. The information is stored in the storage capacitor in the form of an electric charge which represents a logic value (0 or 1). By driving the read-out transistor via a word line, the information can be read out via a bit line. The electric charge stored in the storage capacitor drives the bit line in this case.

Since the storage density increases from memory generation to memory generation, the required area of the single-transistor memory cell must be reduced from generation to generation. This leads to fundamental technological and physical problems. For example, despite the smaller area of the single-transistor memory cell, the storage capacitor must be able to store a minimum amount of electric charge in order thereby to be able to drive the bit line.

The problem is circumvented in an alternative DRAM cell configuration in which so-called gain cells are used as memory cells. Here, too, the information is stored in the form of an electric charge. However, the electric charge does not have to drive a bit line directly, but rather is stored in a gate electrode of a transistor and serves only to control the latter, for which purpose a very small amount of electric charge is actually sufficient.

A gain cell having three transistors is described in an article authored by M. Heshami, 1996 IEEE J., "Solid-State Circuits", Vol. 31, No. 3. The electric charge is stored in a gate electrode of a first transistor. The electric charge is stored with the aid of a second transistor. The gate electrode of the first transistor is connected to a first source/drain region of the second transistor and a second source/drain region of the second transistor is connected to a writing bit line. For the purpose of storage, a gate electrode of the second transistor is driven via a writing word line. The amount of electric charge and thus the information stored in the gate electrode of the first transistor in the process is determined by a voltage on the writing bit line. The information is read out with the aid of a third transistor. A second source/drain region of the first transistor is connected to a first source/drain region of the third transistor and a second source/drain region of the third transistor is connected to a read-out bit line. For the purpose of read-out, a gate electrode of the third transistor is driven via a read-out word line. The amount of electric charge, and thus the information, is read out via the read-out bit line.

SUMMARY OF THE INVENTION

It is accordingly an object of the invention to provide a DRAM cell configuration and method for its fabrication which overcome the hereinafore-mentioned disadvantages of the heretofore-known products and methods of this general type, and in which a DRAM cell configuration whose memory cells take the form of gain cells each having three transistors and which can be fabricated with a particularly high component density and a method for fabricating such a DRAM cell configuration.

With the foregoing and other objects in view there is provided, in accordance with the invention, a DRAM cell, including memory cells each having a first transistor, a second transistor and a third transistor; a writing bit line, a writing word line, a read-out word line and a read-out bit line; the first transistor has a gate electrode and a second source/drain region; the second transistor has a gate electrode, a first source/drain region, and a second source/drain region, the gate electrode of the first transistor is connected to the first source/drain region of the second transistor, the second source/drain region of the second transistor is connected to the writing bit line, the gate electrode of the second transistor is connected to the writing word line; the third transistor has a gate electrode, a first source/drain region, and a second source/drain region, the gate electrode of the third transistor is connected to the read-out word line, the second source/drain region of the first transistor is connected to the first source/drain region of the third transistor, the second source/drain region of the third transistor is connected to the read-out bit line; and the first transistor, the second transistor and the third transistor are vertical MOS transistors.

In a DRAM cell according to the invention, at least one transistor of the memory cell is configured as a vertical transistor. It is advantageous to configure all three transistors of the memory cell as vertical transistors since the area of the memory cell is smaller.

It lies within the scope of the invention to form the three transistors on the sidewalls of the first trench and of the second trench which run essentially parallel to one another. The gate electrode of the first transistor, in which the information is stored, is connected to the first source/drain region of the second transistor via a conductive structure which is within the first trench, and adjoins a second sidewall on which none of the three transistors is formed.

In order that no currents flow along sidewalls of the first trenches and of the second trenches between neighboring source/drain regions (doped by a first conductivity type) of different transistors, heavily doped channel stop regions can be produced by inclined implantation of the sidewalls of the first trenches and of the second trenches between the transistors. The channel stop regions are doped by a second conductivity type opposite to the first conductivity type.

In order to reduce the area of the memory cell, it is advantageous if source/drain regions of neighboring transistors which are to be electrically connected to one another are coincident.

It lies within the scope of the invention, in order to improve various properties of the DRAM cell configuration, to integrate not only the three transistors of the memory cell but also further components, such as e.g. capacitors, in the memory cell.

On account of leakage currents, the information must be written anew to the gate electrodes of the first transistors at regular intervals. In order to prolong the intervals, it is advantageous to provide each of the memory cells with a capacitor, the first capacitor plate of which is connected to the second gate electrode of the first transistor.

In accordance with an added feature of the invention, there is a substrate formed of a semiconductor material, the substrate has a first trench with a first side wall and a second trench with a first side wall formed therein, the first side wall of the first trench and the first side wall of the second trench are provided with a gate dielectric, the first trench is essentially disposed parallel to the second trench, the gate electrode of the second transistor is disposed within the first trench and adjoins the first sidewall of the first trench, the gate electrode of the third transistor is disposed within the second trench and adjoins the first sidewall of the second trench; the writing word line is disposed along the first trench; and the read-out word line is disposed along the second trench.

In accordance with another feature of the invention, the first trench has a bottom, the second trench has a bottom, the first source/drain region of the second transistor adjoins the bottom of the first trench; the first source/drain region of the third transistor adjoins the bottom of the second trench; the second source/drain region of the second transistor laterally adjoins the first sidewall of the first trench; the second source/drain region of the third transistor laterally adjoins the first sidewall of the second trench; and the writing bit line and the read-out bit line are disposed transversely with respect to the writing word line and the read-out word line, the writing bit line is disposed above the first source/drain regions of the second transistor and the read-out bit line is disposed the first source/drain region of the third transistor.

In accordance with an additional feature of the invention, the second trench has a second sidewall provided with the gate dielectric, the gate electrode of the first transistor is disposed within the second trench and adjoins the second sidewall of the second trench; the first source/drain region of the third transistor is coincident with the second source/drain region of the first transistor; the first source/drain region of the first transistor laterally adjoins the second sidewall of the second trench; there is a conductive structure having a horizontal element and a vertical element, the gate electrode of the first transistor is connected to the first source/drain region of the second transistor by the conductive structure; there is a first insulating layer having a first part, the first part is disposed above the first source/drain region of the first transistor, the horizontal element is disposed above the first part of the first insulating layer; the first trench has a second sidewall, the vertical element is disposed within the first trench and adjoins the second sidewall of the first trench; and the read-out bit line is coincident with the writing bit line.

In accordance with another added feature of the invention, the first source/drain region of the first transistor laterally adjoins the second sidewall of the first trench; the source/drain region of the first transistor, the second source/drain region of the first transistor, the first source/drain region of the second transistor, the second source/drain region of the second transistor, the first source/drain region of the third transistor and the second source/drain region of the third transistor are doped by a first conductivity type; the substrate has a surface and a layer adjoining the surface, the layer has a first dopant concentration and is doped by the first conductivity type, the substrate is doped by a second conductivity type opposite to the first conductivity type in the layer; there is a first channel stop region adjoining the second sidewall of the first trench disposed in the substrate, the first channel stop region is doped by the second conductivity type and has a second dopant concentration higher than the first dopant concentration; and the second sidewall of the first trench is provided with the gate dielectric.

In accordance with another additional feature of the invention, there is a depression filled with insulating material, neighboring second source/drain regions of second transistors and neighboring second source/drain regions of third transistors are each insulated from one another by the depression filled with insulating material.

In accordance with a further added feature of the invention, the memory cells each have a capacitor, the capacitor has a first capacitor plate, a second capacitor plate and a capacitor dielectric disposed between the first capacitor plate and the second capacitor plate, the first capacitor plate is connected to the first source/drain region of the first transistor.

In accordance with a further additional feature of the invention, there is a second contact, the first capacitor plate is connected to the first source/drain region of the first transistor by the second contact and disposed above the first source/drain region of the first transistor; and the second capacitor plate is disposed above the first capacitor plate and below the bit line, and second capacitor plates of neighboring capacitors are disposed along the first trench are connected to each other.

With the foregoing and other objects in view there is also provided, in accordance with the invention, a method for fabricating a DRAM cell, which includes producing memory cells each having a first transistor, a second transistor and a third transistor; producing writing word lines and read-out word lines and, transverse with respect to the writing word lines and the read-out word lines, writing bit lines and read-out bit lines; producing each of the first transistor, the second transistor and the third transistor with a gate electrode, a first source/drain region and a second source/drain region; connecting the gate electrode of the first transistor to the first source/drain region of the second transistor; connecting the second source/drain region of the second transistor to one of the writing bit lines; connecting the gate electrode of the second transistor to one of the writing word lines; connecting the gate electrode of the third transistor to one of the read-out word lines; connecting the second source/drain region of the first transistor to the first source/drain region of the third transistor; connecting the second source/drain region of the third transistor to one of the read-out bit lines; and producing the first transistor, the second transistor and the third transistor as vertical transistors.

In accordance with an added feature of the invention, there are the steps of producing first trenches with first sidewalls and second trenches with first sidewalls in a substrate, the first trenches are disposed essentially parallel to the second trenches; providing the first sidewalls of the first trenches and the first sidewalls of the second trenches with a gate dielectric; forming the gate electrode of the second transistor within a first trench as a spacer, the gate electrode of the second transistor adjoining the first sidewall of the first trench; disposing the writing word lines along the first trenches; forming the gate electrode of the third transistor within a second trench as a spacer, the gate electrode of the third transistor adjoining the first sidewall of the second trench; and disposing a read-out word line along the second trench.

In accordance with another feature of the invention, there are the steps of producing the first source/drain region of the second transistor to adjoin a bottom of the first trench; producing the first source/drain region of the third transistor to adjoin a bottom of the second trench; producing the second source/drain region of the second transistor to laterally adjoin the first sidewall of the first trench; producing the second source/drain region of the third transistor to laterally adjoin the first sidewall of the second trench; producing the writing bit line and the read-out bit line to run transversely with respect to the writing word line and the read-out word line; and forming the writing bit line above the first source/drain region of the second transistor and forming the read-out bit line above the first source/drain regions of the third transistor.

In accordance with an additional feature of the invention, there are the steps of producing the second trench with a second sidewall and providing the second sidewall with the gate dielectric; forming the gate electrode of the first transistor within the second trench to adjoin the second sidewall of the second trench; producing the second source/drain region of the second transistor to adjoin the bottom of the first trench; producing the first source/drain region of the first transistor to laterally adjoin the second sidewall of the second trench; producing a horizontal element of a conductive structure above the first source/drain region of the first transistor, connecting the horizontal element to the gate electrode of the first transistor; producing the first trench with a second sidewall and producing the gate dielectric to adjoin to the second sidewall of the first trench; producing a vertical element of the conductive structure within the first trench to adjoin a second sidewall of the first trench, producing the vertical element to connect to the first source/drain region of the second transistor and to the horizontal element of the conductive structure; and producing the bit lines for serving as both the read-out bit lines and as the writing bit lines.

In accordance with another added feature of the invention, there are the steps of forming the substrate with a semiconductor material, a layer and a surface, doping the substrate by a second conductivity type with a first dopant concentration in the layer adjoining the surface of the substrate; forming the first source/drain region of the first transistor to laterally adjoin the second sidewall of the first trench; forming the second source/drain region of the third transistor of a first memory cell and a second source/drain region of the second transistor of a neighboring second memory cell to one of adjoin one another and are coincident; producing the first source/drain region of the first transistor, the second source/drain region of the first transistor, the first source/drain region of the second transistor, the second source/drain region of the second transistor, the first source/drain region of the third transistor and the second source/drain region of the third transistor by implantation in the substrate including doping of the substrate with a first conductivity type opposite to the second conductivity type; producing outside the first trench, a first channel stop region doped with the second conductivity type by implantation, producing the first channel stop region to adjoin to the second sidewall of the first trench and having a second dopant concentration higher than the first dopant concentration; and disposing the bit line above the first source/drain region of the first transistor, the second source/drain region of the first transistor, the first source/drain region of the second transistor, the second source/drain region of the second transistor, the first source/drain region of the third transistor and the second source/drain region of the third transistor.

In accordance with another additional feature of the invention, there are the steps of producing a region doped with the first conductivity type in the layer of the substrate; applying an insulating material to the surface and etching the insulating material to produce a structured, first insulating layer; producing the first source/drain region of the first transistor, the second source/drain region of the second transistor and the second source/drain region of the third transistor from the region by forming the first trenches and the second trenches; producing, after the formation of the first trench and of the second trench, the first channel stop region by inclined implantation; after the production of the first channel stop region, using a fifth photoresist mask in strip form during the implantation of the first source/drain region of the third transistor, the second source/drain region of the first transistor and the first source/drain region of the second transistor, for protecting the second regions situated between neighboring bit lines against implantation; depositing and etching back conductive material in the first trench and the second trench to produce the gate electrode of the first transistor, the gate electrode of the second transistor and the gate electrode of the third transistor after the application of the gate dielectric, the gate electrode of the first transistor, the gate electrode of the second transistor and the gate electrode of the third transistor are produced in the form of spacers; providing a sixth photoresist mask and further etching of the conductive material such that neighboring first gate electrodes along the second trenches are insulated from one another by etching the conductive material; subsequently filling the first trench and the second trench with insulating material; producing a third insulating structure made of insulating material by depositing and etching the insulating material with the aid of a tenth photoresist mask, producing the third insulating structure such that the second source/drain region of the third transistor and the second source/drain region of the second transistor are partially uncovered; subsequently applying further conductive material and structuring the further conductive material with the aid of an eleventh photoresist mask to produce the bit lines and contacts of the bit lines on top of the third insulating structure.

In accordance with a further added feature of the invention, there are the steps of producing a second insulating structure after the production of the first insulating structure by applying more of the insulating material and etching the insulating material with the aid of a seventh photoresist mask, the seventh photoresist mask does not cover the second sidewalls of the first trenches and the second sidewalls of the second trenches, resulting in the first gate electrode being partially uncovered; and producing a conductive structure with the aid of an eighth photoresist mask and etching, the eighth photoresist mask does not cover the second sidewalls of the first trenches resulting in the first source/drain region of the second transistor being partially uncovered by the etching process and conductive material is deposited and structured to form the conductive structure.

In accordance with yet another feature of the invention, there are the steps of applying a conductive layer over the insulating material before the insulating material applied to the surface is etched; partially removing the conductive layer, with the aid of a twelfth photoresist mask covering the second sidewalls of the first trenches and the second sidewalls of the second trenches after the first trench and the second trench have been filled with the insulating material for forming a first insulating layer; subsequently applying more of the insulating material and structuring the insulating material with the aid of a thirteenth photoresist mask which does not cover the second sidewalls of the first trenches for forming a second insulating layer; subsequently uncovering by etching the first source/drain region of the second transistor; and subsequently depositing conductive material and structuring the deposited conductive material for producing the conductive structure.

In accordance with yet a further addition feature of the invention, there is the step of producing the region by implantation, with the aid of a first photoresist mask covering the fourth regions situated between the second source/drain regions of the second transistors, for insulating neighboring second source/drain regions of the second transistors.

In accordance with yet another further added feature of the invention, there are the steps of producing the region by implantation without a mask; and producing depressions and filling the depression with insulating material to insulate neighboring second source/drain regions of second transistors.

In accordance with yet another additional feature of the invention, there are the steps of producing a capacitor having a first capacitor plate, a capacitor dielectric and a second capacitor plate for each of the memory cells; and connecting the first capacitor plate to the first source/drain region of the first transistor.

In accordance with a concomitant feature of the invention, there are the steps of producing the first capacitor plate above the first source/drain region of the first transistor; producing a second contact for connecting the first capacitor plate to the first source/drain region of the first transistor; producing the capacitor dielectric above the first capacitor plate, producing the second capacitor plate above the capacitor dielectric, and producing the bit line above the second capacitor plate; and connecting second capacitor plates of neighboring capacitors along the first trench.

Other features which are considered as characteristic for the invention are set forth in the appended claims.

Although the invention is illustrated and described herein as embodied in a DRAM cell configuration and method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
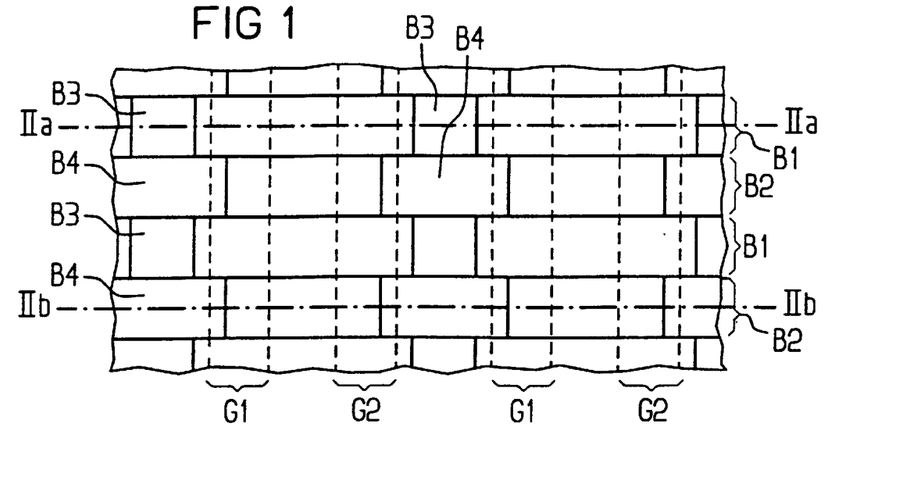
FIG. 1 is a diagram of a surface of a first substrate, the surface is subdivided into first regions which include third regions, and second regions which include fourth regions.
Figure 2A:
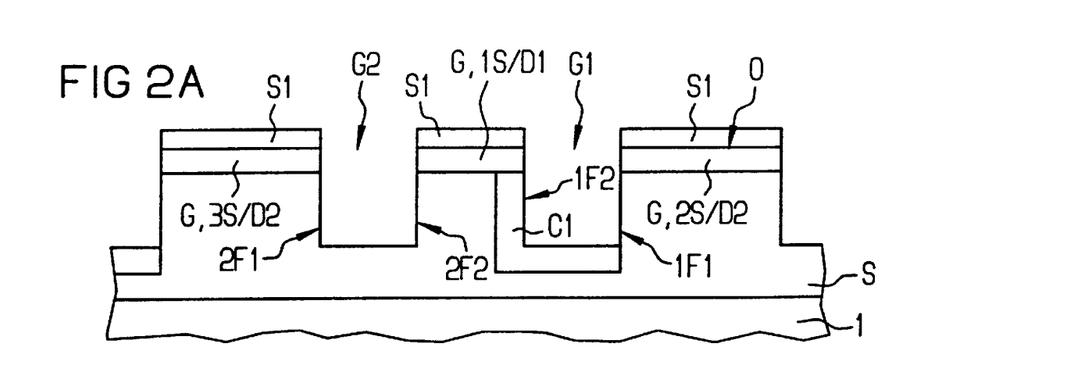
FIG. 2a is a cross-sectional view taken along the line IIa—IIa of FIG. 1 of a first region through the first substrate, doped in a layer, after the production of a first insulating layer, first trenches, second trenches, first source/drain regions of first transistors, second source/drain regions of second transistors, second source/drain regions of third transistors, first channel stop regions and second channel stop regions.

Referring now to the figures of the drawing in detail and first, particularly, to FIG. 2a thereof, there is shown a a first exemplary embodiment having a first substrate 1 made of silicon which is p-doped in a layer S. The layer S has a thickness of approximately 2 μm and adjoins a surface O of the first substrate 1. The dopant concentration is approximately $10^{17} cm^{-3}$. The surface O has first regions B1 and second regions B2 (see FIGS. 1 and 2). The first regions B1 and the second regions B2 are in the form of strips with a width of approximately 0.5 μm and run parallel to one another. The first regions B1 and the second regions B2 are disposed alternately next to one another and adjoin one another. The first regions B1 include rectangular third regions B3 having a width of approximately 0.5 μm and a length of approximately 0.5 μm (see FIG. 1). The distance between the centers of neighboring third regions B3 of a first region B1 is approximately 2.25 μm. The smallest distance between neighboring third regions B3 of neighboring first regions B1 is approximately 1 μm. With the aid of a first photoresist mask (not illustrated), which covers fourth regions B4 (see FIG. 1) which have a length of approximately 1 μm and a width of approximately 0.5 μm and are disposed within the second regions B2 between the third regions B3, an n-doped region G having a depth of approximately 150 nm is produced by implantation (see FIGS. 2a and 2b). The dopant concentration of the region G is approximately $5*10^{20} cm^{-3}$.

Figure 2B:
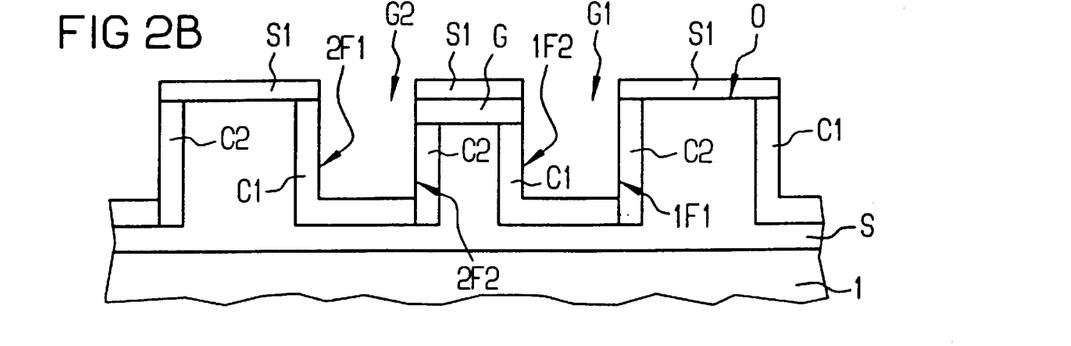
FIG. 2b is a cross-sectional view taken along the line IIb—IIb of FIG. 1 which is a center line of one of the second regions.

A first insulating layer S1 made of $SiO_2$ is deposited on the surface O and is structured by anisotropic etching with the aid of a second photoresist mask (not illustrated) (see FIGS. 2a and 2b). A suitable etchant such as $CHF_3+O_2$ can be used. First trenches G1 and second trenches G2 which run parallel to one another transversely with respect to the first regions B1 and the second regions B2 are produced by anisotropic etching of silicon selectively with respect to the $SiO_2$ (see FIGS. 2a and 2b). The structured first insulating layer S1 serves as a mask. A suitable etchant is HBrF. The first trenches G1 and the second trenches G2 are approximately 0.6 μm deep, 0.5 μm wide and 500 μm long and are disposed alternately next to one another. The shortest distance between the center line of a first trench G1 and the center of the third region B3 and the shortest distance between the center line of the second trench G2 and the center of the third region B3 are approximately 625 nm. Parts of the region G which remain within the third regions B3 are suitable as second source/drain regions 2S/D2 of second transistors and, at the same time, as second source/drain regions 3S/D2 of third transistors. Parts of the region G which remain within the first regions B1 between the third regions B3 are suitable as first source/drain regions 1S/D1 of first transistors. Parts of the region G which remain within the second regions B2 connect together the first source/drain regions 1S/D1 of neighboring first transistors along the second trenches G2.

With the aid of a third photoresist mask, which does not cover the first regions B1 and also the first trenches G1, p-doped first channel stop regions C1 are produced by implantation (see FIG. 2a). The implantation is effected in an inclined manner such that the first channel stop regions C1 adjoin second sidewalls 1F2 of the first trenches G1 and parts of first sidewalls 2F1 of the second trenches G2, which parts are situated within the second regions B2. On the second sidewalls 1F2 of the first trench G1 and on the first sidewalls 2F1 of the second trenches G2, the width of the first channel stop regions C1 is approximately 100 nm. The dopant concentration of the first channel stop regions C1 is approximately $10^{19} cm^{-3}$.

With the aid of a fourth photoresist mask (not illustrated), which does not cover the second regions B2, p-doped second channel stop regions C2 are produced by implantation (see FIG. 2b). The implantation is effected in an inclined manner such that the second channel stop regions C2 adjoin first sidewalls 1F1 of the first trenches G1 and second sidewalls 2F2 of the second trenches G2. On the first sidewalls 1F1 of the first trenches G1 and on the second sidewalls 2F2 of the second trenches G2, the width of the second channel stop regions C2 is approximately 100 nm. The dopant concentration of the second channel stop regions C2 is approximately $10^9 cm^{-3}$ or $10^{19} cm^{-3}$.

Figure 4:
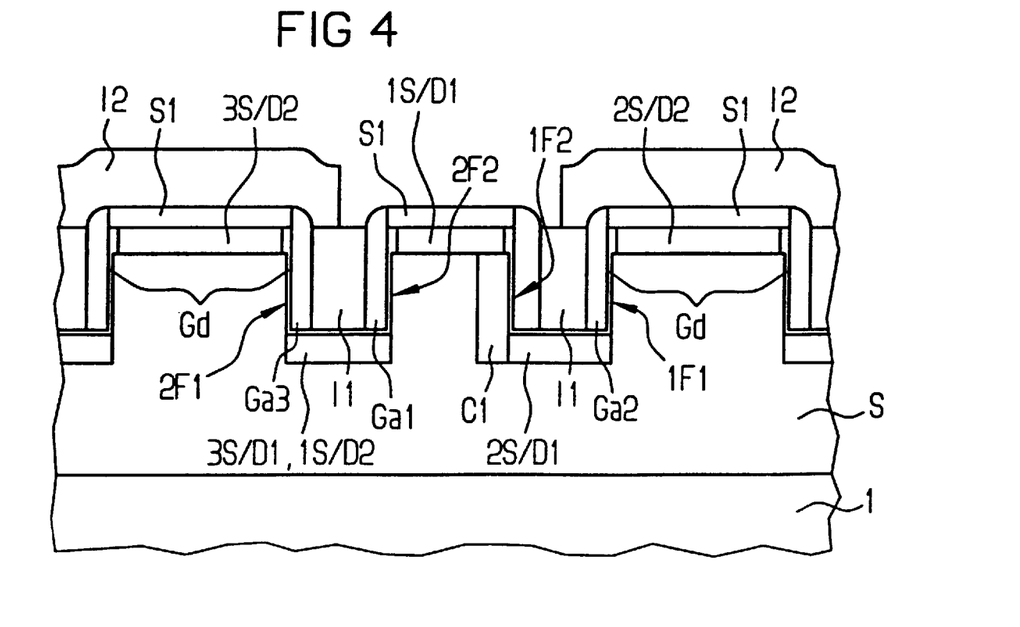
FIG. 4 is the cross-sectional view of FIG. 2a after the production of the first source/drain regions of the second transistors, the first source/drain regions of the third transistors, the second source/drain regions of the first transistors, the gate dielectric, the first gate electrodes, the gate electrodes of the second transistors, the gate electrodes of the third transistors, a first insulating structure and a second insulating structure.

With the aid of a fifth photoresist mask (not illustrated), which covers the second regions B2, implantation is carried out to produce first source/drain regions 2S/D1 (adjoining bottoms of the first trenches G1) of the second transistors and first source/drain regions 3S/D1 (adjoining bottoms of the second trenches G2) of the third transistors, which, at the same time, are second source/drain regions 1S/D2 of the first transistors (see FIG. 4). A subsequent RTP process activates the dopant of the first source/drain region 2S/D1 of the second transistor and that of the first source/drain region 3S/D1 of the third transistor. The first source/drain region 2S/D1 of the second transistor and the first source/drain region 3S/D1 of the third transistor are n-doped and have a dopant concentration of approximately $5*10^{20} cm^{-3}$.

Figure 3:
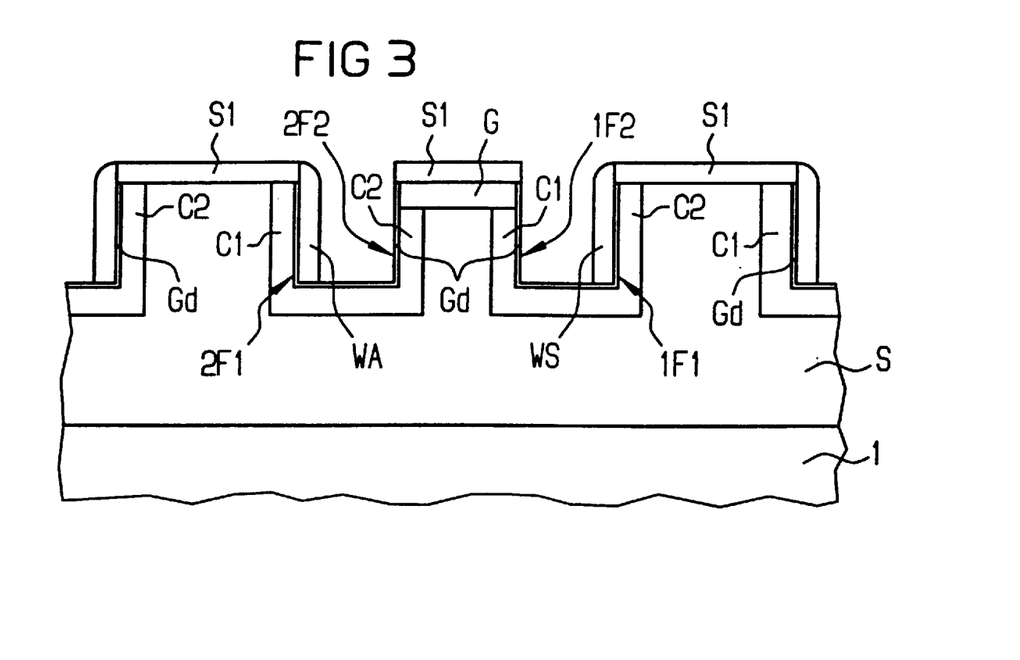
FIG. 3 is the cross-sectional view of FIG. 2b, after the production of first source/drain regions of the second transistors, first source/drain regions of the third transistors, second source/drain regions of the first transistors, a gate dielectric, gate electrodes of the first transistors, gate electrodes of the second transistors and gate electrodes of the third transistors.

A gate dielectric Gd, which covers the first sidewalls 1F1, the second sidewalls 1F2, a bottom of the first trench G1, the first sidewalls 1F2, the second sidewalls 2F2 and a bottom of the second trench G2, is produced by thermal oxidation (see FIG. 3).

Doped polysilicon is subsequently deposited to a thickness of approximately 150 nm and etched back, producing spacers on the sidewalls of the first trench G1 and of the second trench G2 (see FIGS. 3, 4). A suitable etchant such as $C_2F_6+O_2$ can be used. Spacers on the first sidewalls 1F1 of the first trenches G1 act as writing word lines WS. Spacers on the first sidewalls 2F1 of the second trenches G2 act as read-out word lines WA. First parts of the spacers which are disposed within the first regions B1 and adjoin the second sidewalls 2F2 of the second trenches G2 act as gate electrodes Ga1 of the first transistors. Parts of the writing word lines WS which are disposed within the first regions B1 act as gate electrodes Ga2 of the second transistors. Parts of the read-out word lines WA which are disposed within the first regions B1 act as the gate electrodes Ga3 of the third transistors. With the aid of a sixth photoresist mask (not illustrated), which does not cover the second sidewalls 1F2 of the first trenches G1 and the second sidewalls 2F2 of the second trenches G2 in the second regions B2, second parts of the spacers are removed by etching polysilicon, in such a way that the gate electrodes Ga1 of neighboring first transistors along the second trenches G2 are insulated from one another (see FIGS. 3 and 4). The spacers adjoining the first channel stop regions C1 and the second channel stop regions C2 cannot release any channel currents in the first channel stop regions C1 and in the second channel stop regions C2 on account of the high dopant concentration of the first channel stop regions C1 and of the second channel stop regions C2. Channel regions of neighboring second transistors and also channel regions of neighboring third transistors are thereby isolated from one another.

In order to form a first insulating structure I1, the first trenches G1 and the second trenches G2 are filled with $SiO_2$, in that the $SiO_2$ is deposited and then etched back isotropically (see FIG. 4).

In order to form a second insulating structure I2, $SiO_2$ is deposited to a thickness of approximately 250 nm and then etched with the aid of a seventh photoresist mask (not illustrated). The seventh photoresist mask does not cover the second sidewalls 1F2 of the first trenches G1 and the second sidewalls 2F2 of the second trenches G2 within the first regions B1, as a result of which a second insulating structure I2 is produced (see FIG. 4).

Subsequently, with the aid of an eighth photoresist mask (not illustrated), which does not cover the second sidewalls 1F2 of the first trenches G1 within the first regions B1, the polysilicon is etched using $C_2F_6+O_2$, for example, and then the $SiO_2$ is etched using $CHF_3+O_2$, for example, to remove the spacers on the second sidewalls 1F2 of the first trenches G1 and to uncover part of the bottom of the first trenches G1.

Figure 5:
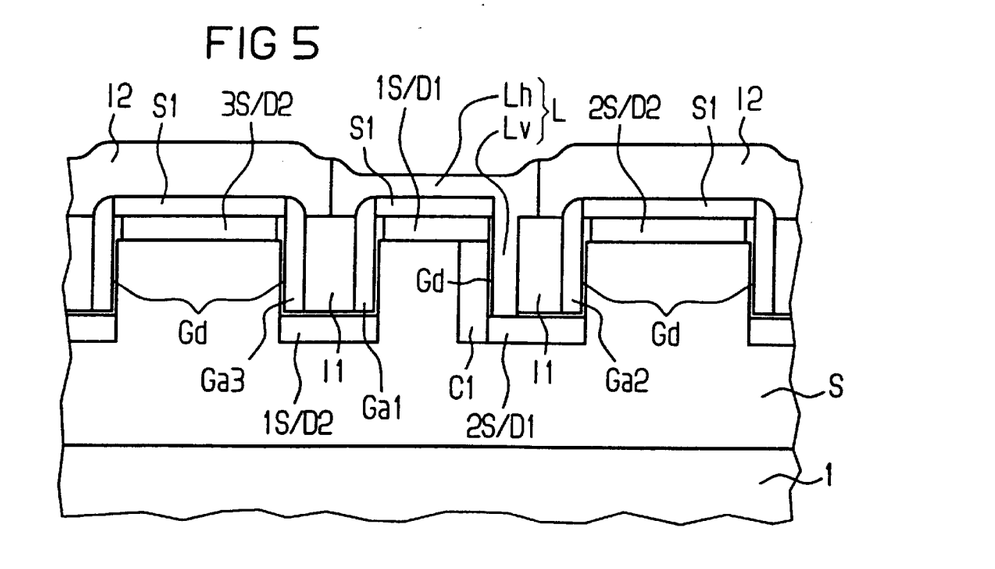
FIG. 5 is the cross-sectional view of FIG. 4 after the production of conductive structures which each connect the gate electrode of the first transistor to the first source/drain region of the second transistor.

In order to produce conductive structures L, doped polysilicon is subsequently deposited to a thickness of approximately 150 nm. With the aid of a ninth photoresist mask (not illustrated), which covers the second sidewalls 1F2 of the first trenches G1 and the second sidewalls 2F2 of the second trenches G2 in the first regions B1, the polysilicon is etched, producing the conductive structures L. The conductive structures L have a horizontal element Lh and a vertical element Lv, which each connect the gate electrode Ga1 of the first transistor to the associated first source/drain region 2S/D1 of the second transistor (see FIG. 5).

Figure 6:
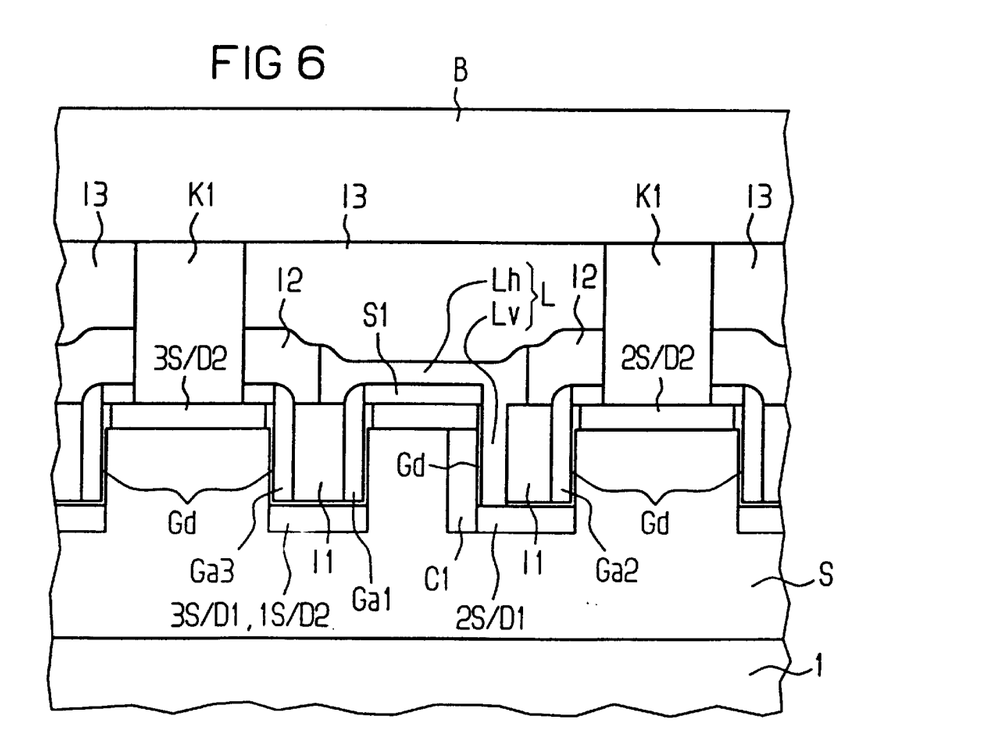
FIG. 6 is the cross-sectional view of FIG. 5 after the production of bit lines and contacts of the bit lines.

A third insulating structure I3 is subsequently produced by depositing $Sio_2$ to a thickness of approximately 500 nm and etching it with the aid of a tenth photoresist mask (not illustrated). The tenth photoresist mask does not cover the third regions B3 and etching is performed until parts of the second source/drain regions 3S/D2 of the third transistors are uncovered (see FIG. 6). Tungsten, for example, is then deposited and etched back, producing first contacts K1 of the bit lines B. A suitable etchant is $SF_6$, for example. The bit lines B are in strip form and run parallel to one another transversely with respect to the writing word lines WS and read-out word lines WA.

In order to produce the bit lines B, aluminum, for example, is firstly deposited and then structured with the aid of an eleventh photoresist mask (not illustrated). The eleventh photoresist mask does not cover the second regions B2 (see FIG. 6).

Figure 7:
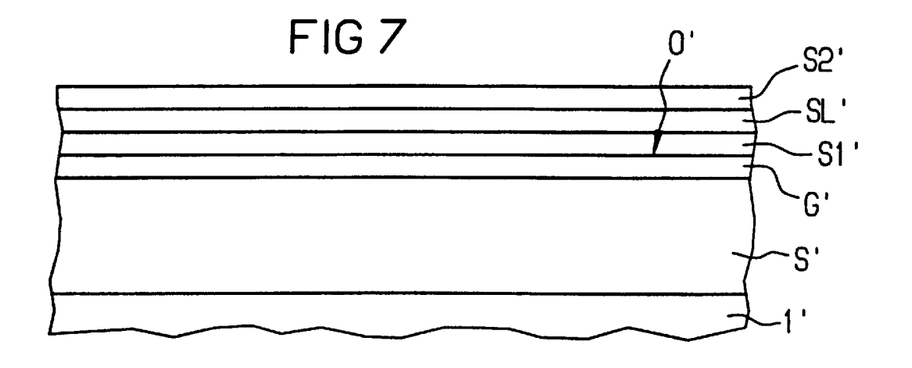
FIG. 7 is a cross-sectional view, analogous to the cross-sectional view of FIG. 2a, through a second substrate, doped in a layer, after the implantation of the first region and the deposition of the first insulating layer, the conductive layer and the second insulating layer.

In a second exemplary embodiment, a second substrate 1' made of silicon is p-doped in a layer S', which has a thickness of approximately 2 µm and adjoins a surface O' of the second substrate 1'. The dopant concentration is approximately $10^{17} cm^{-3}$. In an analogous manner to the first exemplary embodiment, the surface O' of the second substrate 1' has first regions and second regions. In an analogous manner to the first exemplary embodiment, the first regions include third regions and the second regions include fourth regions. As in the first exemplary embodiment, an n-doped region G' having a depth of approximately 150 nm is produced by implantation. A first insulating layer S1' made of $SiO_2$ and having a thickness of approximately 150 nm is subsequently deposited. A conductive layer SL' made of polysilicon is deposited over that. A second insulating layer S2' made of $SiO_2$ and having a thickness of approximately 200 nm is deposited over that (see FIG. 7).

Figure 8:
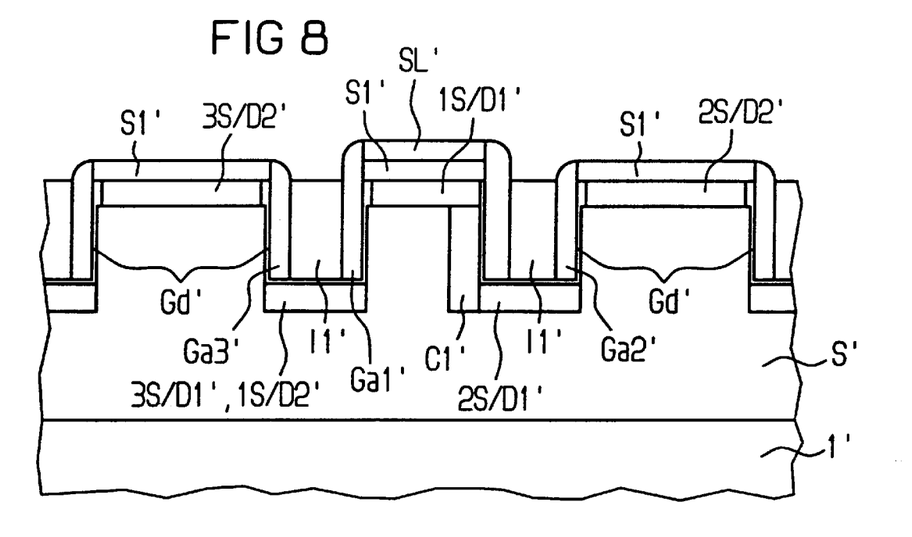
FIG. 8 is the cross-sectional view of FIG. 7 after the production of the first trenches, the second trenches, the first source/drain regions of the first transistors, the second source/drain regions of the second transistors, the second source/drain regions of the third transistors, the channel stop regions, the first source/drain regions of the second transistors, the first source/drain regions of the third transistors, the second source/drain regions of the first transistors, the gate dielectric, the gate electrodes of the first transistors, the gate electrodes of the second transistors, the gate electrodes of the third transistors and the first insulating structure.
Figure 9:
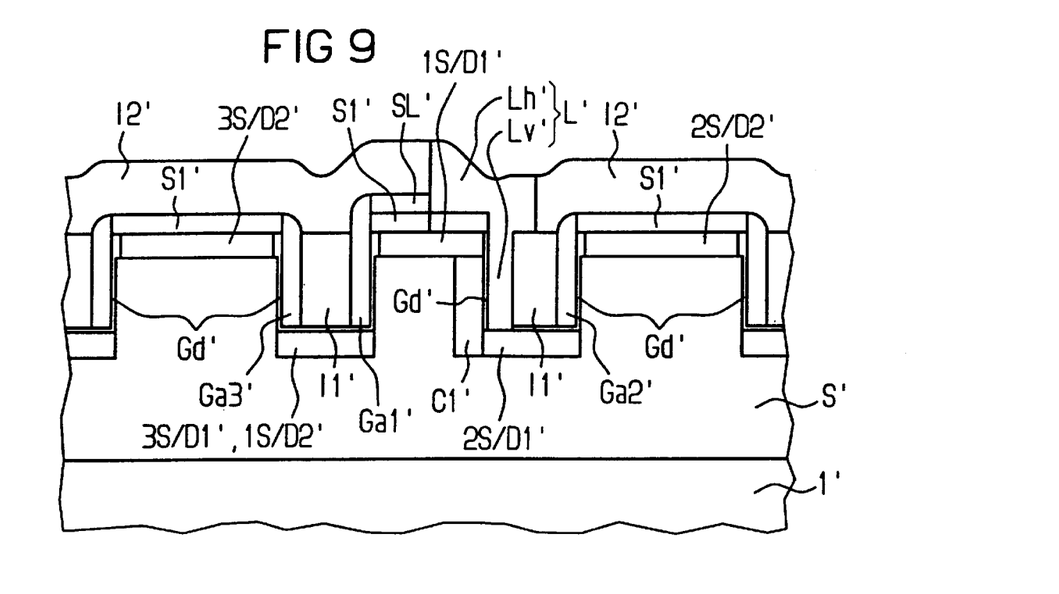
FIG. 9 is the cross-sectional view of FIG. 8 after the production of the second insulating structure and the conductive structure.

First trenches G1', second trenches G2', first source/drain regions 1S/D1' of the first transistors, second source/drain regions 3S/D2' of the third transistors and second source/drain regions 2S/D2' of the second transistors are subsequently produced, as in the first exemplary embodiment. Remaining parts of the second insulating layer S2' are then removed by etching $SiO_2$ selectively with respect to the silicon. First channel stop regions C1', second channel stop regions, first source/drain regions 2S/D1' of the second transistors, first source/drain regions 3S/D1' of the third transistors, second source/drain regions 1S/D2' of the first transistors, a gate dielectric Gd', gate electrodes Ga1' of the first transistors, gate electrodes Ga2' of the second transistors, gate electrodes Ga3' of the third transistors, writing word lines and read-out word lines are subsequently produced, as in the first exemplary embodiment. As in the first exemplary embodiment, the gate electrodes Ga1' of neighboring first transistors along the second trenches G2' are insulated from one another with the aid of a sixth photoresist mask. As in the first exemplary embodiment, the first trenches G1' and the second trenches G2' are subsequently filled with a first insulating structure I1' made of $SiO_2$. With the aid of a twelfth photoresist mask (not illustrated), which covers the second sidewalls of the first trenches G1' and the second sidewalls of the second trenches G2' in the first regions, polysilicon is etched selectively with respect to $SiO_2$ (see FIG. 8). A second insulating structure I2' is subsequently produced, in that $SiO_2$ is deposited and etched with the aid of a thirteenth photoresist mask (not illustrated). The thirteenth photoresist mask does not cover the second sidewalls of the first trenches G1' in the first regions, and etching is performed until part of the conductive layer SL' is uncovered. Subsequently, polysilicon is etched and then $SiO_2$ again is etched in such a way that parts of the bottoms of the first trenches G1' are uncovered. Doped polysilicon is subsequently deposited to a thickness of approximately 250 nm and etched back, producing conductive structures L' having horizontal elements Lh' and vertical elements Lv', which each connect a gate electrode Ga1' of a first transistor to a first source/drain region 2S/D1' of a second transistor (see FIG. 9).

As in the first exemplary embodiment, a third insulating structure, bit lines and first contacts of bit lines are subsequently produced.

In a third exemplary embodiment, a third substrate 1" made of silicon is p-doped in a layer S", which has a thickness of approximately 2 µm and adjoins a surface O" of the third substrate 1". The dopant concentration is approximately $10^{17} cm^{-3}$. As in the first exemplary embodiment, the surface O" has first regions and second regions. As in the first exemplary embodiment, the first regions include third regions and the second regions include fourth regions. An n-doped region G" having a depth of approximately 150 nm is produced by implantation without a mask. Subsequently, in an analogous manner to the second exemplary embodiment, a first insulating layer S1" made of $SiO_2$, a conductive layer SL" made of polysilicon, a second insulating layer made of $SiO_2$, first trenches G1" and second trenches G2" are produced (see FIG. 10).

Figure 10:
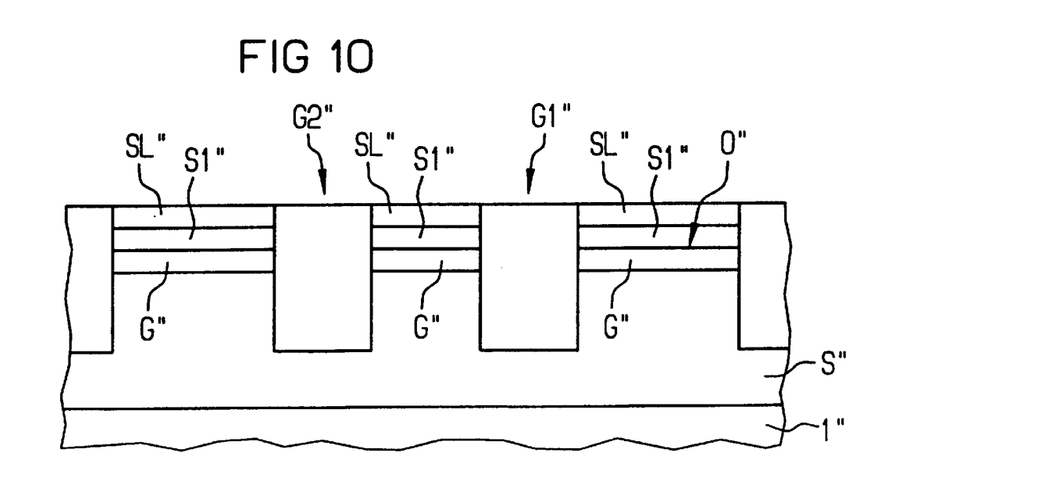
FIG. 10 is a cross-sectional view, analogous to the cross-sectional view of FIG. 2b, through a third substrate after the production of the first insulating layer, the conductive layer and $Sio_2$ filled first trenches and second trenches.
Figure 11:
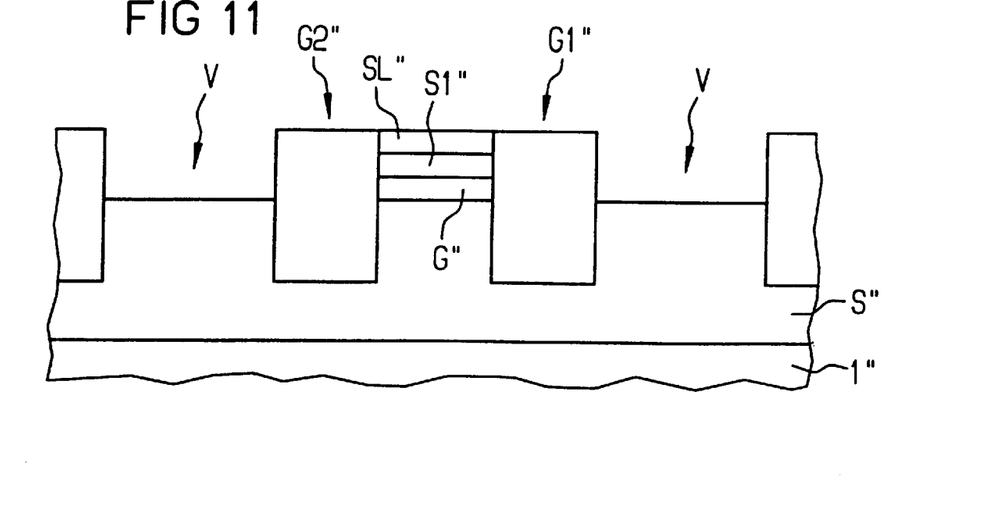
FIG. 11 is the cross-sectional view of FIG. 10 after the production of depressions.

$SiO_2$ is subsequently deposited and etched back, as a result of which the first trenches and the second trenches are filled with $SiO_2$ (see FIG. 10). With the aid of a thirteenth photoresist mask, which does not cover the fourth regions, first of all $SiO_2$, then polysilicon and then $SiO_2$ are etched, thereby uncovering parts of the surface. The thirteenth photoresist mask is removed. Depressions are subsequently produced by etching silicon selectively with respect to $SiO_2$ down to a depth of approximately 300 nm. Remaining parts of the region G" are suitable as a second source/drain regions of second transistors, second source/drain regions of third transistors and as first source/drain regions of first transistors. $SiO_2$ is then etched, thereby uncovering the sidewalls and the bottoms of the first trenches G1" and of the second trenches G2".

First channel stop regions, second channel stop regions, first source/drain regions of the first transistors, second source/drain regions of the first transistors, first source/drain regions of the second transistors, a gate dielectric, gate electrodes of the first transistors, gate electrodes of the second transistors and gate electrodes of the third transistors are subsequently produced, as in the second exemplary embodiment. With the aid of a fourteenth photoresist mask, which, in the second regions, does not cover the second sidewalls of the first trenches and the second sidewalls of the second trenches and the third regions and also parts of the fourth regions, polysilicon is etched, as a result of which respective gate electrodes of neighboring first transistors along the second trenches and respective second/drain regions of neighboring second transistors along the second trenches are insulated from one another.

Conductive structures, bit lines and first contacts of bit lines are subsequently produced, in an analogous manner to the second exemplary embodiment.

Figure 12:
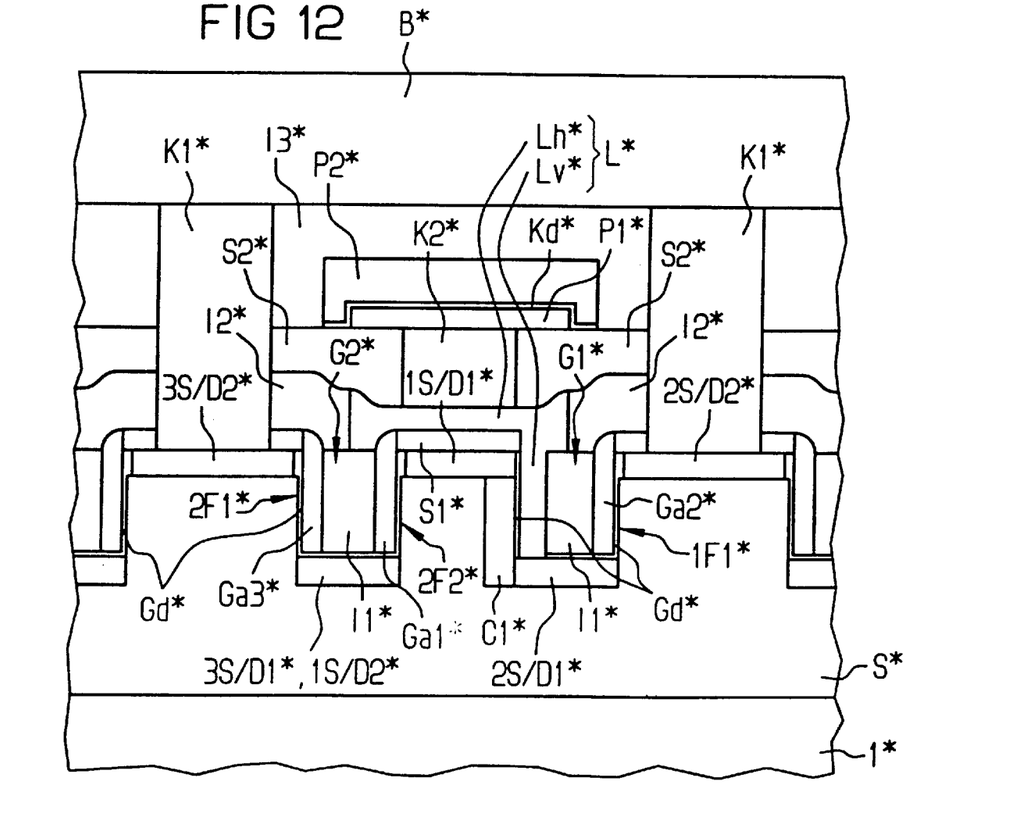
FIG. 12 is a cross-sectional, analogous to the cross-sectional view of FIG. 6, through a fourth substrate after completion of the DRAM cell configuration, the memory cells of which each have three vertical transistors and a capacitor.

As shown in FIG. 12, capacitors can be incorporated into the memory cells of the three exemplary embodiments. This is explained in a fourth exemplary embodiment. In an analogous manner to the first exemplary embodiment, the first trenches G1*, the second trenches G2*, the first source/drain regions 1S/D1* of the first transistors, the second source/drain regions 3S/D2* of third transistors, the second source/drain regions 2S/D2* of the second transistors, the first channel stop regions C1*, the second channel stop regions, the first source/drain regions 2S/D1* of the second transistors, the first source/drain regions 3S/D1* of the third transistors, the second source/drain regions 1S/D2* of the first transistors, the gate dielectric Gd*, the gate electrodes Ga1* of the first transistors, the gate electrodes Ga2* of the second transistors, the gate electrodes Ga3* of the third transistors, the writing word lines, the read-out word lines, the first insulating structure I1", the second insulating structure I2* and the conductive structures L* having the horizontal elements Lh* and the vertical elements Lv* are produced.

A second insulating layer S2* having a thickness of approximately 300 nm is subsequently produced by depositing $SiO_2$. With the aid of a fifteenth photoresist mask (not illustrated), which does not cover parts of the horizontal elements Lh* of the conductive structures L* above the first source/drain regions 1S/D1* of the first transistors, $SiO_2$ is etched until the parts of the horizontal elements Lh* of the conductive structures L* above the first source/drain regions 1S/D1* of the first transistors are uncovered. Second contacts K2* of first capacitor plates P1* to be produced are subsequently produced by depositing tungsten, for example, and etching it back.

Platinum, for example, is subsequently deposited to a thickness of approximately 200 nm. With the aid of a sixteenth photoresist mask (not illustrated), which, within the first regions, does not cover parts of the second insulating layer S2* above the second source/drain regions 2S/D2* of the second transistors and the second source/drain regions 3S/D2* of the third transistors, platinum is etched using $Cl_2+O_2$, for example, as a result of which the first capacitor plates P1* are produced.

Barium strontium titanate is subsequently deposited to a thickness of approximately 20 nm and platinum is deposited over that to a thickness of approximately 200 nm. With the aid of a seventeenth photoresist mask (not illustrated), which does not cover regions in strip form which run parallel to the first trenches and are disposed between the not yet formed first contacts K1*, form the first capacitor plates P1*. Platinum and barium strontium titanate are simultaneously etched using $Cl_2+O_2$, for example, as a result of which second capacitor plates P2* and capacitor dielectrics Kd* are produced.

A third insulating structure I3*, first contacts K1* of the bit lines B*, and the bit lines B* are subsequently produced as in the first exemplary embodiment.

There are many conceivable variations of the exemplary embodiments which likewise lie within the scope of the invention. In particular, the dimensions of the described layers, regions and trenches can be adapted to the respective requirements. The same also applies to the dopant concentrations proposed. Structures and layers made of $SiO_2$ can be produced, in particular, by thermal oxidation or by a deposition process. Polysilicon may be doped either during or after the deposition. Instead of doped polysilicon, it is also possible to use e.g. metal silicides and/or metals. Suitable materials for the capacitor dielectrics are primarily dielectrics having high dielectric constants, such as perovskites.

In order to produce the first insulating structure, instead of etching back deposited $SiO_2$ it is also possible to employ chemical mechanical polishing and subsequent slight overetching. The same applies to the production of the conductive structure.

We claim:
1. A DRAM cell, comprising:
memory cells each having a first vertical MOS transistor, a second vertical MOS transistor and a third vertical MOS transistor;
a writing bit line, a writing word line, a read-out word line and a read-out bit line;
said first transistor having a gate electrode and a second source/drain region;
said second transistor having a gate electrode, a first source/drain region, and a second source/drain region, said gate electrode of said first transistor connected to said first source/drain region of said second transistor, said second source/drain region of said second transistor connected to said writing bit line, said gate electrode of said second transistor connected to said writing word line; and
said third transistor having a gate electrode, a first source/drain region, and a second source/drain region, said gate electrode of said third transistor connected to said read-out word line, said second source/drain region of said first transistor connected to said first source/drain region of said third transistor, said second source/drain region of said third transistor connected to said read-out bit line.
2. The DRAM cell according to claim 1, including:
a semiconductor substrate having a first trench with a first side wall and a second trench with a first side wall formed therein, said first side wall of said first trench and said first side wall of said second trench are provided with a gate dielectric, said first trench is essentially disposed parallel to said second trench, said gate electrode of said second transistor is disposed within said first trench and adjoins said first sidewall of said first trench, said gate electrode of said third transistor is disposed within said second trench and adjoins said first sidewall of said second trench;
said writing word line disposed along said first trench; and
said read-out word line disposed along said second trench.
3. The DRAM cell according to claim 2, wherein:
said first trench has a bottom, said second trench has a bottom, said first source/drain region of said second transistor adjoins said bottom of said first trench;
said first source/drain region of said third transistor adjoins said bottom of said second trench;
said second source/drain region of said second transistor laterally adjoins said first sidewall of said first trench;
said second source/drain region of said third transistor laterally adjoins said first sidewall of said second trench; and
said writing bit line and said read-out bit line disposed transversely with respect to said writing word line and said read-out word line, said writing bit line disposed above said first source/drain regions of said second transistor and said read-out bit line is disposed said first source/drain region of said third transistor.
4. The DRAM cell according to claim 3, wherein said second trench has a second sidewall provided with said gate dielectric, said gate electrode of said first transistor is disposed within said second trench and adjoins said second sidewall of said second trench;
wherein said first source/drain region of said third transistor is coincident with said second source/drain region of said first transistor;
wherein said first source/drain region of said first transistor laterally adjoins said second sidewall of said second trench;

including a conductive structure having a horizontal element and a vertical element, said gate electrode of said first transistor connected to said first source/drain region of said second transistor by said conductive structure;

including a first insulating layer having a first part, said first part disposed above said first source/drain region of said first transistor, said horizontal element disposed above said first part of said first insulating layer;

wherein said first trench has a second sidewall, said vertical element is disposed within said first trench and adjoins said second sidewall of said first trench; and wherein said read-out bit line is coincident with said writing bit line.

5. The DRAM cell according to claim 4, wherein said first source/drain region of said first transistor laterally adjoins said second sidewall of said first trench;

wherein said source/drain region of said first transistor, said second source/drain region of said first transistor, said first source/drain region of said second transistor, said second source/drain region of said second transistor, said first source/drain region of said third transistor and said second source/drain region of said third transistor are doped by a first conductivity type;

wherein said substrate has a surface and a layer adjoining said surface, said layer has a first dopant concentration and is doped by said first conductivity type, said substrate is doped by a second conductivity type opposite to said first conductivity type in said layer;

including a first channel stop region adjoining said second sidewall of said first trench disposed in said substrate, said first channel stop region is doped by said second conductivity type and has a second dopant concentration higher than said first dopant concentration; and wherein said second sidewall of said first trench is provided with said gate dielectric.

6. The DRAM cell according to claim 1, including a depression filled with insulating material, neighboring second source/drain regions of second transistors and neighboring second source/drain regions of third transistors are each insulated from one another by said depression filled with insulating material.

7. The DRAM cell according to claim 1, wherein said memory cells each have a capacitor, said capacitor having a first capacitor plate, a second capacitor plate and a capacitor dielectric disposed between said first capacitor plate and said second capacitor plate, said first capacitor plate connected to said first source/drain region of said first transistor.

8. The DRAM cell according to claim 7, including a second contact, said first capacitor plate is connected to said first source/drain region of said first transistor by said second contact and disposed above said first source/drain region of said first transistor; and wherein said second capacitor plate is disposed above said first capacitor plate and below said bit line, and second capacitor plates of neighboring capacitors disposed along said first trench are connected to each other.

9. A method for fabricating a DRAM cell, which comprises:

producing memory cells each having a first vertical MOS transistor, a second vertical MOS transistor and a third vertical MOS transistor;

producing writing word lines and read-out word lines and, transverse with respect to the writing word lines and the read-out word lines, writing bit lines and read-out bit lines;

producing each of the first transistor, the second transistor and the third transistor with a gate electrode, a first source/drain region and a second source/drain region;

connecting the gate electrode of the first transistor to the first source/drain region of the second transistor;

connecting the second source/drain region of the second transistor to one of the writing bit lines;

connecting the gate electrode of the second transistor to one of the writing word lines;

connecting the gate electrode of the third transistor to one of the read-out word lines;

connecting the second source/drain region of the first transistor to the first source/drain region of the third transistor; and connecting the second source/drain region of the third transistor to one of the read-out bit lines.

10. The method according to claim 9, which comprises:

producing first trenches with first sidewalls and second trenches with first sidewalls in a substrate, the first trenches are disposed essentially parallel to the second trenches;

providing the first sidewalls of the first trenches and the first sidewalls of the second trenches with a gate dielectric;

forming the gate electrode of the second transistor within a first trench as a spacer, the gate electrode of the second transistor adjoining the first sidewall of the first trench;

disposing the writing word lines along the first trenches;

forming the gate electrode of the third transistor within a second trench as a spacer, the gate electrode of the third transistor adjoining the first sidewall of the second trench; and disposing a read-out word line along the second trench.

11. The method according to claim 10, which comprises:

producing the first source/drain region of the second transistor to adjoin a bottom of the first trench;

producing the first source/drain region of the third transistor to adjoin a bottom of the second trench;

producing the second source/drain region of the second transistor to laterally adjoin the first sidewall of the first trench;

producing the second source/drain region of the third transistor to laterally adjoin the first sidewall of the second trench;

producing the writing bit line and the read-out bit line to run transversely with respect to the writing word line and the read-out word line; and forming the writing bit line above the first source/drain region of the second transistor and forming the read-out bit line above the first source/drain regions of the third transistor.

12. The method according to claim 11, which comprises:

producing the second trench with a second sidewall and providing the second sidewall with the gate dielectric;

forming the gate electrode of the first transistor within the second trench to adjoin the second sidewall of the second trench;

producing the second source/drain region of the second transistor to adjoin the bottom of the first trench;

producing the first source/drain region of the first transistor to laterally adjoin the second sidewall of the second trench;

producing a horizontal element of a conductive structure above the first source/drain region of the first transistor, connecting the horizontal element to the gate electrode of the first transistor;

producing the first trench with a second sidewall and producing the gate dielectric to adjoin the second sidewall of the first trench;

producing a vertical element of the conductive structure within the first trench to adjoin to a second sidewall of the first trench, producing the vertical element to connect to the first source/drain region of the second transistor and to the horizontal element of the conductive structure; and producing the bit lines for serving as both the read-out bit lines and as the writing bit lines.

13. The method according to claim 12, which comprises:

forming the substrate with a semiconductor material, a layer and a surface, doping the substrate by a second conductivity type with a first dopant concentration in the layer adjoining the surface of the substrate;

forming the first source/drain region of the first transistor to laterally adjoin the second sidewall of the first trench;

forming the second source/drain region of the third transistor of a first memory cell and a second source/drain region of the second transistor of a neighboring second memory cell to one of adjoin one another and are coincident;

producing the first source/drain region of the first transistor, the second source/drain region of the first transistor, the first source/drain region of the second transistor, the second source/drain region of the second transistor, the first source/drain region of the third transistor and the second source/drain region of the third transistor by implantation in the substrate including doping of the substrate with a first conductivity type opposite to the second conductivity type;

producing outside the first trench, a first channel stop region doped with the second conductivity type by implantation, producing the first channel stop region to adjoin to the second sidewall of the first trench and having a second dopant concentration higher than the first dopant concentration; and disposing the bit line above the first source/drain region of the first transistor, the second source/drain region of the first transistor, the first source/drain region of the second transistor, the second source/drain region of the second transistor, the first source/drain region of the third transistor and the second source/drain region of the third transistor.

14. The method according to claim 13, which comprises:

producing a region doped with the first conductivity type in the layer of the substrate;

applying an insulating material to the surface and etching the insulating material to produce a structured, first insulating layer;

producing the first source/drain region of the first transistor, the second source/drain region of the second transistor and the second source/drain region of the third transistor from the region by forming the first trenches and the second trenches;

producing, after the formation of the first trench and of the second trench, the first channel stop region by inclined implantation;

after the production of the first channel stop region, using a fifth photoresist mask in strip form during the implantation of the first source/drain region of the third transistor, the second source/drain region of the first transistor and the first source/drain region of the second transistor, for protecting the second regions situated between neighboring bit lines against implantation;

depositing and etching back conductive material in the first trench and the second trench to produce the gate electrode of the first transistor, the gate electrode of the second transistor and the gate electrode of the third transistor after the application of the gate dielectric, the gate electrode of the first transistor, the gate electrode of the second transistor and the gate electrode of the third transistor are produced in the form of spacers;

providing a sixth photoresist mask and further etching of the conductive material such that neighboring first gate electrodes along the second trenches are insulated from one another by etching the conductive material;

subsequently filling the first trench and the second trench with insulating material;

producing a third insulating structure made of insulating material by depositing and etching the insulating material with the aid of a tenth photoresist mask after the production of the conductive structure, producing the third insulating structure such that the second source/drain region of the third transistor and the second source/drain region of the second transistor are partially uncovered;

subsequently applying further conductive material and structuring the further conductive material with the aid of an eleventh photoresist mask to produce the bit lines and contacts of the bit lines on top of the third insulating structure.

15. The method according to claim 14, which comprises:

producing a second insulating structure after the production of the first insulating structure by applying more of the insulating material and etching the insulating material with the aid of a seventh photoresist mask, the seventh photoresist mask does not cover the second sidewalls of the first trenches and the second sidewalls of the second trenches, resulting in the first gate electrode being partially uncovered; and producing a conductive structure with the aid of an eighth photoresist mask and etching, the eighth photoresist mask does not cover the second sidewalls of the first trenches resulting in the first source/drain region of the second transistor being partially uncovered by the etching process and conductive material is deposited and structured to form the conductive structure.

16. The method according to claim 14, which comprises:

applying a conductive layer over the insulating material before the insulating material applied to the surface is etched;

partially removing the conductive layer, with the aid of a twelfth photoresist mask covering the second sidewalls of the first trenches and the second sidewalls of the second trenches after the first trench and the second trench have been filled with the insulating material for forming a first insulating layer;

subsequently applying more of the insulating material and structuring the insulating material with the aid of a thirteenth photoresist mask which does not cover the second sidewalls of the first trenches for forming a second insulating layer;

subsequently uncovering by etching the first source/drain region of the second transistor; and subsequently depositing conductive material and structuring the deposited conductive material for producing the conductive structure.

17. The method according to claim 15, which comprises producing the region by implantation, with the aid of a first photoresist mask covering the fourth regions situated between the second source/drain regions of the second transistors, for insulating neighboring second source/drain regions of the second transistors.

18. The method according to claim 15, which comprises:

producing the region by implantation without a mask; and producing depressions and filling the depression with insulating material to insulate neighboring second source/drain regions of second transistors.

19. The method according to claim 9, which comprises:

producing a capacitor having a first capacitor plate, a capacitor dielectric and a second capacitor plate for each of the memory cells; and connecting the first capacitor plate to the first source/drain region of the first transistor.

20. The method according to claim 19, which comprises:

producing the first capacitor plate above the first source/drain region of the first transistor;

producing a second contact for connecting the first capacitor plate to the first source/drain region of the first transistor;

producing the capacitor dielectric above the first capacitor plate, producing the second capacitor plate above the capacitor dielectric, and producing the bit line above the second capacitor plate; and connecting second capacitor plates of neighboring capacitors along the first trench.

* * * * *